United States Patent
Stutzman et al.

(10) Patent No.: US 6,829,144 B1
(45) Date of Patent: Dec. 7, 2004

(54) FLIP CHIP PACKAGE WITH HEAT SPREADER ALLOWING MULTIPLE HEAT SINK ATTACHMENT

(75) Inventors: Randall J. Stutzman, Vestal, NY (US); Jamil A. Wakil, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/634,554

(22) Filed: Aug. 5, 2003

(51) Int. Cl.[7] .................................................. H05K 7/20
(52) U.S. Cl. ...................... 361/704; 361/719; 257/718; 257/719; 165/80.3; 24/458
(58) Field of Search ................................ 361/704, 709, 361/717–719; 165/80.3, 185; 174/16.3, 252; 257/718, 719, 722, 727; 24/453, 457, 458; 248/505, 510

(56) References Cited

U.S. PATENT DOCUMENTS

| | | | |
|---|---|---|---|
| 5,808,236 A | | 9/1998 | Brezina et al. ............... 174/16 |
| 5,870,285 A | | 2/1999 | Kosteva et al. ............. 361/704 |
| 5,901,039 A | * | 5/1999 | Dehaine et al. ............. 361/704 |
| 6,084,178 A | | 7/2000 | Cromwell .................. 174/35 R |
| 6,125,037 A | | 9/2000 | Bollesen ...................... 361/704 |
| 6,180,874 B1 | | 1/2001 | Brezina et al. ................ 174/16 |
| 6,198,630 B1 | * | 3/2001 | Cromwell .................... 361/704 |
| 6,209,623 B1 | * | 4/2001 | Tantoush .................... 165/80.3 |
| 6,243,264 B1 | | 6/2001 | Bollesen et al. ............. 361/704 |
| 6,614,659 B2 | * | 9/2003 | Feigenbaum et al. ....... 361/719 |
| 6,646,881 B1 | * | 11/2003 | Lai et al. ..................... 361/719 |
| 6,724,632 B2 | * | 4/2004 | Lee et al. ..................... 361/719 |
| 6,741,470 B2 | * | 5/2004 | Isenburg ...................... 361/704 |
| 2004/0057212 A1 | * | 3/2004 | Russell et al. .............. 361/704 |
| 2004/0066627 A1 | * | 4/2004 | Liu .............................. 361/704 |

* cited by examiner

*Primary Examiner*—Boris Chervinsky
(74) *Attorney, Agent, or Firm*—John A. Jordan; William H. Steinberg

(57) ABSTRACT

A chip package is provided with multiple ways of attaching a heat sink directly to the chip carrier. Corner post are mounted to the surface of the chip carrier. A heat spreading plate, with a surface area substantially the same size as the surface area of the chip carrier, is positioned in thermal contact with the surface of a flip chip, for example. The heat spreading plate has corner cuts to accommodate the corner posts of the chip carrier and notches cut into at least two opposing sides. A heat sink plate with holes extending therethrough at each of its four corners is positioned to allow the corner posts of said chip carrier to extend therethrough. Notches cut in two opposing sides of said heat sink plate are aligned with the notches in said heat spreading plate to create slots for a flexible clip to clamp the assembly together. Alternatively, nuts may also be threaded onto the posts to clamp the assembly together.

20 Claims, 3 Drawing Sheets

FLIP CHIP PACKAGE WITH HEAT SPREADER ALLOWING MULTIPLE HEAT SINK ATTACHMENT

BACKGROUND OF THE INVENTION

1. Field of the Invention

The present invention relates to an electronic packaging arrangement. More particularly, the present invention relates to an electronic packaging arrangement employing a heat spreader designed to facilitate multiple and reworkable heat sink attachment directly to chip carrier.

2. Background and Related Art

As the integrated circuit art moves toward smaller and smaller component sizes leading to increased density of circuits and more and more input/output (I/O) connections, the heat generated by such increased density increases correspondingly. Moreover, with such increased density, the cost of integrated circuit packages, such as flip chip packages, also increases.

Thus, efficient cooling and reworkability of such packages is highly desirable. Accordingly, where electronic device failure of the package occurs, efficient heat dissipating structure should be such as to be readily removed in non-destructive manner.

Typically, heat sink arrangements employing heat fins are positioned in thermal contact with the integrated circuit package mounted on a printed circuit board (PCB). The heat sink is, in turn, removably attached to the printed circuit board. An elastomeric thermal pad or thermal grease may be interposed between heat sink and integrated circuit package to compensate for any mismatch in physical characteristics and thermal expansion between heat sink and integrated circuit package, as well as reduce interface resistance. An example of such an arrangement may be found in U.S. Pat. No. 6,125,037. One of the difficulties in cooling integrated circuit packages is thermally contacting a sufficiently large heat dissipating surface to the integrated circuit to effectively spread heat generated therefrom. Packaging constraints often limit the area size of the heat dissipating surface, particularly where such packages are designed to be reworkable. Moreover, integrated circuit products, such as, single chip flip chip modules, often employ different cooling arrangements for the same product. For example, flip chips may be employed in a single chip module using some form of clip to hold the heat sink in thermal contact with the chip on the PCB. Alternatively, the heat sink may be attached by screws or posts to the PCB.

SUMMARY OF THE PRESENT INVENTION

In accordance with the present invention, a packaging arrangement is provided wherein a heat sink and heat spreading lid are directly attached to the chip carrier. The heat spreading lid is sufficiently large to accommodate effective spreading of heat from the chip and yet is designed to allow heat sink attachment by either posts positioned directly on the chip carrier at its corners, or by some form of chip arrangement clamped to the underside of the lid or chip carrier at the mid-section of the heat sink.

It is, therefore, an object of the present invention to provide an improved integrated circuit package.

It is a further object of the present invention to provide an integrated circuit package with improved cooling.

It is yet a further object of the present invention to provide an improved reworkable flip chip package.

It is yet still a further object of the present invention to provide an improved heat sink attachment arrangement wherein the heat sink is attached directly to the chip carrier.

It is another object of the present invention to provide a removable heat sink and heat spreading lid that provides effective chip cooling, with said heat spreading lid arranged to facilitate heat sink attachment to the chip carrier by posts arranged on the carrier or by clipping to the lid or carrier.

It is yet another object of the present invention to provide a chip module having attachment posts on the chip carrier for attaching a heat sink directly to the chip carrier, and a heat spreading lid interposing the heat sink and chip or chips with the surface area of the lid being approximately the size of the surface area of the chip carrier so as to effectively spread heat, protect the chip(s) and facilitate heat sink attachment by either the attachment posts or a heat sink clip acting to clamp the heat sink to the chip carrier.

These foregoing and other objects, features and advantages of the invention will be apparent from the following more particular description of a preferred embodiment of the invention, as illustrated in the accompanying drawings, wherein like reference members represent like parts of the invention.

DETAILED DESCRIPTION

Figure 1:
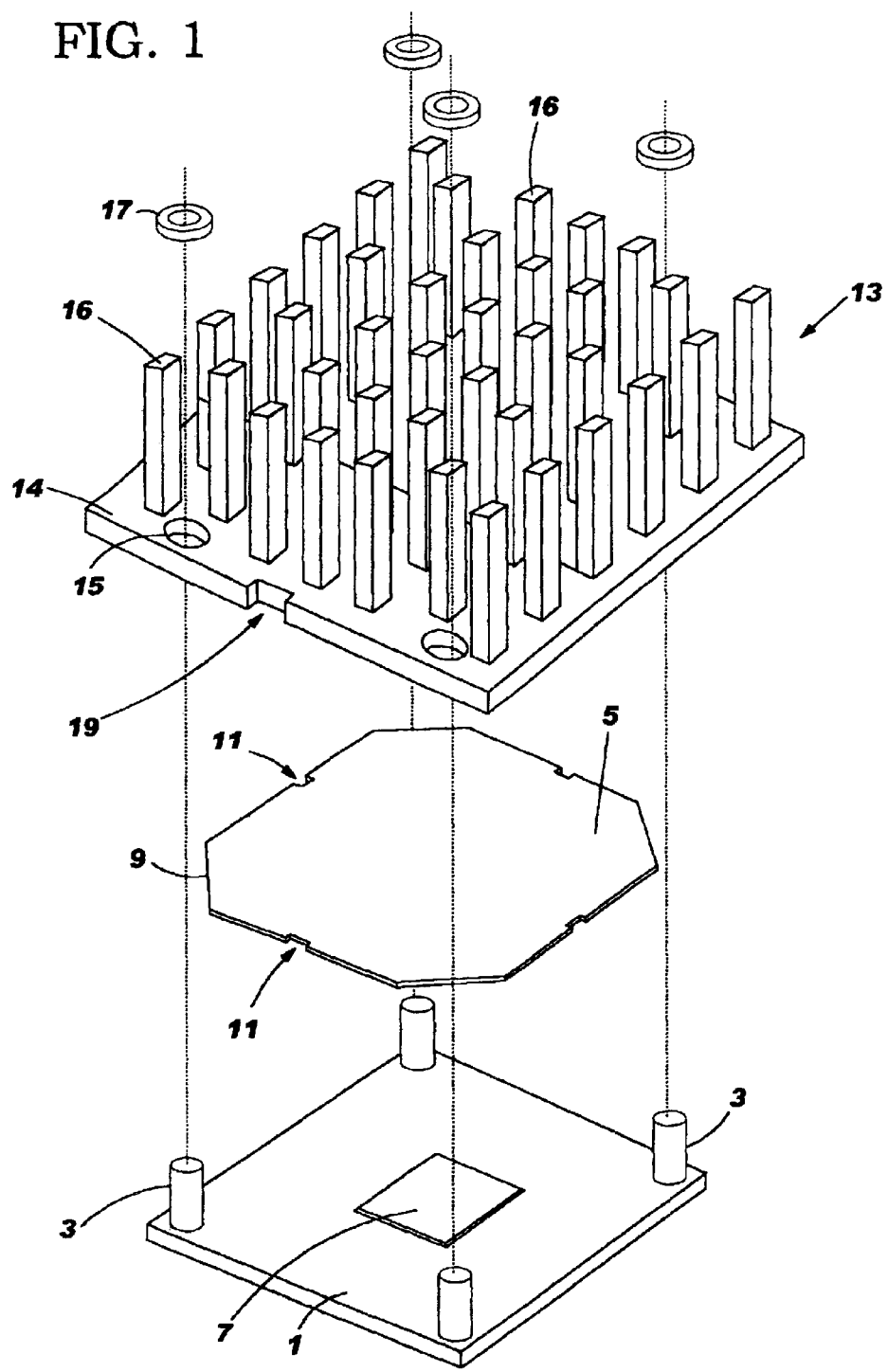
FIG. 1 shows an exploded perspective view of the chip package, in accordance with the present invention.

With reference to FIG. 1, there is shown an exploded view of the integrated circuit package, in accordance with the present invention. Chip carrier 1 is shown with four retention corner posts 3 mounted thereon. Chip carrier 1 may be made of any of a variety of chip carrier materials, such as a laminate chip carrier material.

Corner retention posts 3 may be made of any of a variety of materials such as, metal or plastic, although metal would be more effective in aiding heat dissipation. The post may be affixed to chip carrier 1 by glue or an epoxy adhesive. If the posts are metallized, they may be attached by soldering, welding or the like. In this regard, using an epoxy, solder, or the like, avoids the necessity of having to modify the chip carrier by forming holes in the carrier for screws, post insertion, or the like. In addition, attaching the posts directly to the chip carrier also avoids the necessity of having to modify the PCB, upon which the chip carrier sets, by forming holes for posts or screws to hold the heat sink thereon. Avoiding the necessity of having to form holes in the PCB for attaching the heat sink saves much needed wiring area.

As further shown in FIG. 1, chip 7 is mounted in the central portion of laminate chip carrier 1. As is known to those skilled in the art, an array of solder ball connections on the down side of flip chip 7 are attached to a corresponding array of pads on chip carrier 1. The pads, in turn, are connected to metallurgy which extends to an array of pads on the underside of chip carrier 1. The latter are then attached to contact pads on the PCB.

When the arrangement shown in FIG. 1 is fully assembled, heat spreading lid 5 is positioned in thermal contact with chip 7. The lid may be in the form of a plate or a cap. Heat spreading lid 5 is made of a high thermal conductivity material, such as, a metal. For example, aluminum, copper or AlSiC may be used. The heat spreading lid, in accordance with the present invention, can be formed with a surface area approximately that of the chip carrier. In this regard, the edges of the heat spreading lid may be coextensive with the edges of the carrier except for cutouts 9 at its four corners and cutouts 11 at the midsection of each side. These cutouts minimally reduce the heat dissipating areas of the lid.

As is clear from FIG. 1, cutouts 9 at the four corners of heat spreading lid 5 act to accommodate each of the four posts 3, used for attachment of the lid and sink to chip carrier 1. Cutouts or notches 11 at the mid-section of each side of heat spreading lid 5 act to accommodate attachment of the heat sink and lid to chip carrier 1 using a clip or spring, as shown more specifically in FIG. 2. Although the thickness of the lid can be optimized for heat spreading and height requirements, a typical flip chip arrangement would operate effectively with a lid thickness in the range of 0.5 mm to 4 mm. In this regard, it should be noted that the relative sizes of the various parts shown in FIGS. 1–3A are not to scale, nor scaled proportionately, but are merely shown to facilitate an understanding of the invention.

Heat spreading lid 5 not only acts to effectively dissipate heat from chip 7, it also acts to protect the chip, and its design acts to accommodate different modes of heat sink attachment. Lid 5 is attached to chip 7 using a thermally conductive epoxy, which epoxy allows for effective heat dissipation and provides sufficient compliance for any mismatch in physical and thermal expansion characteristics between lid-heat sink and chip.

Heat sink 13, comprising plate 14 and heat dissipating elements 16, may be attached to chip carrier 1 by positioning posts 3 in holes 15 and clamping in place with nuts 17, with lid 5 interposed between plate 14 and chip carrier. Alternatively, heat sink 13 may also be attached to chip carrier 1 by positioning posts 3 in holes 15 and clamping in place with a clip arranged to fit into notch 11 in heat spreading lid 5 and notch 19 in heat sink 13 and then extend to the underside of lid 5. Alternatively, the clip may be designed to extend beyond the lid to clamp the heat sink to the underside of chip carrier 1.

Since corner posts 3 provide structural support, any of a variety of thermally conductive materials, such as a thermally conductive grease, may be used between heat spreading lid 5 and heat sink 13 to enhance thermal performance. This allows for easy removal of the heat sink for rework. However, it is also possible to use a thermally conductive adhesive between lid 5 and heat sink 13 and, in such case, the use of nuts or a clamp to hold the heat sink in place may not be necessary.

Figure 2:
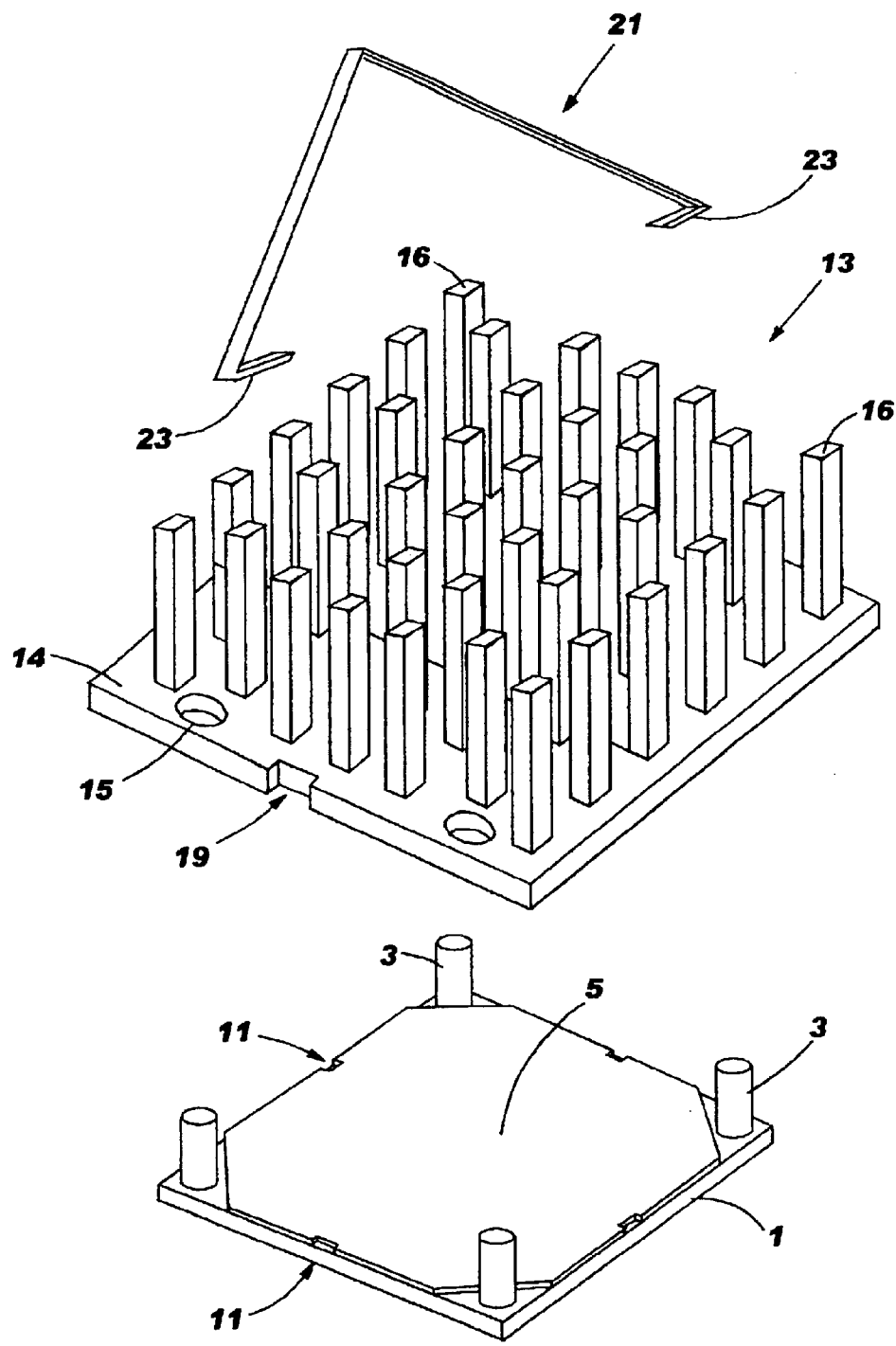
FIG. 2 shows a partially exploded perspective view of the chip package, in accordance with the present invention.

With reference to FIG. 2, there is shown a partially exploded perspective view of the view of FIG. 1, showing a clip arrangement that may be used to clamp the heat sink and lid to chip carrier. Thus, when heat sink 13 is positioned on heat spreading lid 5 so that posts 3 extend up through holes 15 in the heat sink, clip 21 may be positioned to engage both notches 19 in the heat sink and notches 11 in lid 5, and then may expanded by force to clear chip carrier 1 so that, upon release of the force, holding segments 23 of the clip act to engage the underside of the chip carrier, locking the heat sink and lid to the chip carrier. Alternatively, where lid 5 is securely attached to chip 7 with thermally conductive adhesive, for example, the clip may be designed so that upon release of the expanding force, holding segments 23 of the clip act to engage the underside of the lid. It is noted that heat spreading lid 5 has notches on all four sides so that it may be positioned, without regard to orientation, for alignment to notch 19. As can be seen, for maximum heat spreading capability, heat spreading lid 15 is made to extend to the edges of chip carrier 1.

Figure 3:
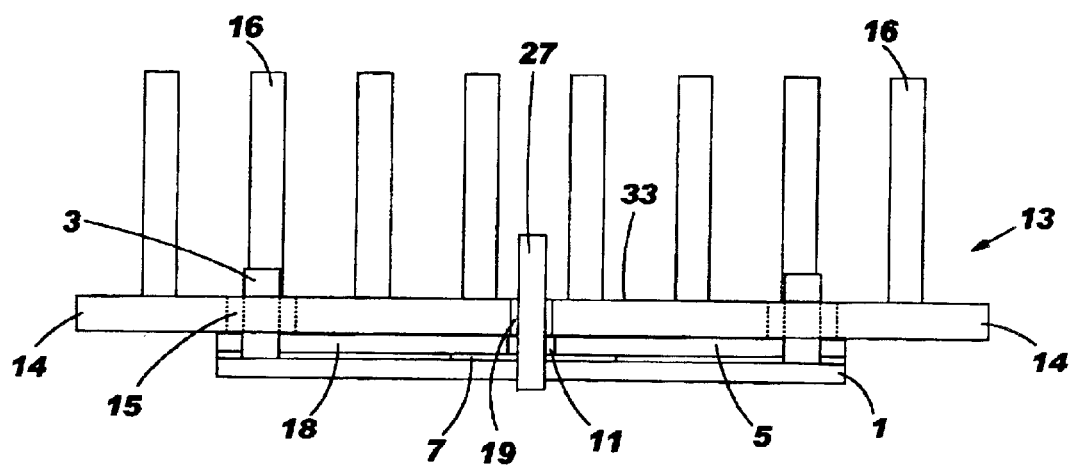
FIG. 3 shows a side view of an assembled chip package.

FIG. 3 shows an end view of the assembled package 25 with like reference characters identifying like elements of FIGS. 1 and 2. As in FIGS. 1 and 2, heat spreading lid 5 is attached to flip chip 7 by a thermally conductive epoxy leaving a gap around the chip between lid and chip carrier 1. Alternatively, the gap may be filled with thermally conductive epoxy 18 or other like material. Similar to FIG. 2, the assembled package of FIG. 3 uses a clip to attach heat sink 13 and lid 5 to chip carrier 1. The design structure of clip 27 is, however, different than the structure of clip 21 of FIG. 2. Although clip 27 is shown in FIG. 3 extending to clamp to the underside of chip carrier 1, as previously described with respect to FIGS. 1 and 2, the clip may also be arranged to extend and clamp to the underside of lid 5.

Figure 3A:
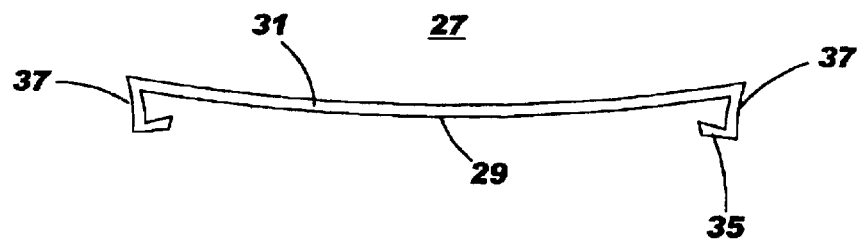
FIG. 3A shows a further clip configuration that may be used to hold the heat sink and heat spreading lid on the chip carrier.

Clip 27 in FIG. 3A is designed so that the bowed midpoint 29 of its lateral element 31 contacts surface 33 of heat sink 13. Clip 27 is engaged by sliding clip holding segments 35 and clip leg segments 37 into respective notches 19 and 11 of the heat sink and lid at opposing edges, and then pressing downwardly so holding segments 35 slide over the edges of chip carrier 1, thereby spreading the clip. After passing over the edges of the chip carrier, the clip returns to its relaxed position whereby holding segments 35 engage the underside of chip carrier 1, thereby clamping the heat sink and lid to the carrier. Alternatively, rather than pressing downwardly to the point of engaging the underside of chip carrier 1, the clip may be pressed to the point of allowing holding segments 35 to slide over and engage the underside of lid 5.

As is understood by those skilled in the art, any of a variety of flexible resilient materials having a high spring rate may be employed to fabricate the clips. In this regard, it is clear that the clip must have the ability to return to its original form, i.e., relaxed state, after being forced out of shape. For example, clips 21 and 27 may be formed from hard type stainless steel or, more generally steel, although other materials such as beryllium copper may be used. Typically, clips 21 and 27 would be integral, i.e., formed from a single piece and are fabricated using well known techniques such as stamping and bending a single piece of metal. The clips may be wire shape or ribbon shape. Also, as is understood by those skilled in the art, the dimensions of the clips must be tailored to the dimensions of the combined heat sink, lid, chip and chip carrier and designed to provide adequate clamping force. It is clear, that other structural design configurations may as well be employed to fabricate a clip to fit over the heat sink and lid in the notches provided therefor to thereby clamp same to the chip carrier.

Rather than employ a clip to attack heat sink 13 to chip carrier 1, nuts may be used on threaded post 3 to hold the assembly together. In this regard, the posts may be designed to have a slightly larger circumference at its base to facilitate good mechanical attachment to the chip carrier.

Regardless of whether the method of attachment is through a clip, attached nuts or adhesive, heat spreading lid 5, as designed, may be used. Thus, a single configuration of heat spreading lid may be used for each method of heat sink attachment. It is clear that the heat spreading lid may also be attached by the above methods without the heat sink. Such an arrangement may be employed where the lid would provide sufficient heat dissipation.

Direct attachment of the heat sink and lid to the chip carrier provides a number of advantages. The resultant package provides a removable heat sink for rework which is capable of assembly without modification to the circuit board upon which it is to be mounted. In this regard, the owner of the circuit board may be the customer while the chip package may be provided by the supplier, and attaching the heat sink to the chip carrier rather than PCB simplifies the process, and reduces the cost and complexity of assembly. In addition, attachment of the heat sink may be undertaken either before or after mounting on the PCB. Moreover, rework to remove the heat sink, lid and chip after mounting is simplified. Since a single heat spreading lid configuration acts to facilitate different modes of heat sink attachment, the mode of heat sink attachment may be changed upon rework.

Although description of the chip package, in accordance with the present invention, has been directed to a single chip, it is clear that more than one chip may be attached to chip carrier 1. Attachment of the chip to the chip carrier may be through a flip chip interconnection by solder balls, or may be by solder or pins, or the like.

It should be understood that the chip package, in accordance with the present invention, is designed to be further attached to some form of substrate, such as, a PCB. Accordingly, although not shown in the chip package of FIG. 3, the underside surface of chip carrier 1, i.e. the side opposing the chip-mounted side, contains an array of contact pads for connection to a PCB, for example. Such pads may be connected to pads on a PCB by solder, solder balls, pins, or the like.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A chip package, comprising:
   a chip carrier having four corner posts mounted thereon and at least one chip attached thereto; and
   a heat sink including a substantially rectangular base plate with holes therethrough at each of its four corners, said heat sink base plate positioned in thermal contact with the said at least one chip attached to said chip carrier so that respective ones of said at least four corner posts mounted on said chip carrier extend through each of said holes, said heat sink base plate having a notch cut at approximately the midpoint of two opposing sides thereof so as to provide a slot to clamp said heat sink directly to said chip carrier.

2. The chip package of claim 1 wherein a substantially rectangular heat spreading lid interposes in thermal contact said rectangular base plate of said heat sink and said at least one chip with said heat spreading lid having a corner cut at each of its four corners to accommodate respective ones of said four corner posts and a notch cut at approximately the midpoint of at least two opposing ones of its four sides to provide a slot to clamp said heat sink directly to said chip carrier.

3. The chip package of claim 2 wherein said heat sink and heat spreading lid are directly attached to said chip carrier by a flexible clip having a holding portion extending over the said rectangular base plate of said heat sink and through the said notch cuts in each side of said heat sink base plate and heat spreading lid, and a clamping portion extending to the underside of said chip carrier to clamp said heat sink and said heat spreading lid directly to said chip carrier.

4. The chip package as set forth in claim 3 wherein said rectangular heat spreading lid is in thermal contact with said at least one chip by a thermally conductive epoxy and said clamping portion of said flexible clip extends to the underside of said lid to clamp said heat sink directly to said chip carrier.

5. The chip package of claim 2 wherein said heat sink is directly attached to said chip carrier by nuts threaded onto each of said four corner posts to clamp said heat sink and said heat spreading lid directly to said chip carrier.

6. The chip package as set forth in claim 2 wherein said the surface area of said heat spreading lid is substantial the same as the surface area of said chip carrier.

7. The chip package as set forth in claim 6 wherein said four corner posts are attached to the surface of said chip carrier by a bonding material.

8. A chip package for mounting on a substrate, comprising:
   a chip carrier having four corner posts mounted thereon with a bonding material and at least one chip attached thereto; and
   heat sink having a substantially rectangular base plate with holes therethrough at each of its four corners and heat dissipating elements extending therefrom, said heat sink base plate positioned in thermal contact with said at least one chip attached to said chip carrier so that respective ones of said at least four corner posts mounted on said chip carrier extend through each of said holes, said heat sink base plate having notch cuts in two opposing sides thereof so as to provide a slot to clamp said heat sink directly to said chip carrier.

9. The chip package of claim 8 wherein a substantially rectangular heat spreading lid is positioned in thermal contact between said at least one chip and said substantially rectangular base plate of said heat sink with said heat spreading lid having a corner cut at each of its four corners to accommodate respective ones of said four corner posts and a notch cut at approximately the midpoint of at least two opposing ones of its four sides so as to align with respective ones of said notch cuts in the two opposing sides of said heat base sink plate, said heat spreading lid having a surface area substantially the same as the surface area of said chip carrier and positioned in thermal contact with said at least one chip by a thermally conductive and resilient adhesive material.

10. The chip package of claim 9 wherein said heat sink and said heat spreading lid are directly attached to said chip carrier by a flexible clip having a holding portion extending over the said rectangular plate of said heat sink and through the said notch cuts in each side of said heat sink and heat spreading lid, and a clamping portion extending to the underside of said lid to clamp said heat sink directly to said chip carrier.

11. The chip package as set forth in claim 9 wherein said clamping portion of said flexible chip extends to the underside of said chip carrier to clamp said heat sink directly to said chip carrier.

12. The chip package of claim 9 wherein said heat sink and said heat spreading lid are directly attached to said chip carrier by nuts threaded onto each of said four corner posts to clamp said beat sink and said heat spreading lid directly to said chip carrier and said four corner posts.

13. A method of providing multiple forms of beat sink attachment in a chip package;
   providing a substantially rectangular chip carrier having corner posts attached to the surface thereof at each of its four corners and at least one chip mounted thereon; and providing a heat sink including a substantially rectangular base plate with holes extending therethrough, one at each of its four corners, and notch cuts at approximately the midpoint of two opposing sides thereon said heat sink positioned in thermal contact with said at least one chip so that respective ones of said corner posts on said chip carrier extend through said holes in said base plate and said notch cuts act to provide a slot on each side for clamping said heat sink directly to said chip carrier.

14. The method as set forth in claim 13 wherein there is provided a substantially rectangular heat spreading plate in thermal contact between said at least one chip and said substantially rectangular base plate of said heat sink with said substantially rectangular heat spreading plate having corner cuts at each of its four corners to accommodate said corner posts on aid chip carrier, said heat spreading plate having notch cuts at the approximately midpoint of two opposing sides thereof aligned with the said notch cuts of said base plate of said heat sink.

15. The method as set forth in claim 14 wherein a flexible clip is positioned in said slot and extended downwardly to spread over one of said heat spreading plate or said chip carrier to directly clamp said heat sink to said chip carrier.

16. The method as set forth in claim 13 wherein nuts are threaded to said posts to directly clamp said heat sink to said chip carrier.

17. The method as set forth in claim 14 wherein the surface area of said heat spreading plate is substantially the same as the surface area of said chip carrier.

18. The method as set forth in claim 17 wherein a flexible bonding material interposes said heat spreading plate and said chip carrier.

19. The method as set forth in claim 18 wherein said four corner posts are attached to the surface of said chip carrier by a bonding material.

20. A chip package, comprising:
- a chip carrier having four corner posts mounted thereon and at least one chip attached thereto;
- a substantially rectangular heat spreading lid positioned in thermal contact with said at least one chip and having a corner cut at each of its four corners to accommodate respective ones of said four corner posts and a notch cut at approximately the midpoint of at least two opposing ones of its four sides; and
- a heat sink including a substantially rectangular plate with holes therethrough at each of its four corners, said heat sink plate positioned in thermal contact with said heat spreading lid so that respective ones of said at least four corner posts extend through each of said holes, said heat sink having a notch cut through two opposing sides thereof so as to align with respective ones of said notch cuts at approximately the midpoint of the said at least two opposing sides of said heat spreading lid such that the notch cuts in the sides of each of said heat spreading lid and heat sink act to provide a slot to clamp said heat sink directly to said chip carrier.

* * * * *